Nov. 22, 1966 R. R. BOCKEMUEHL ETAL 3,287,611

CONTROLLED CONDUCTING REGION GEOMETRY
IN SEMICONDUCTOR DEVICES
Filed Aug. 17, 1961

INVENTORS
Robert R. Bockemuehl
BY E. James E. Kauppila
Robert E. Fowler
ATTORNEY 3,287,611

CONTROLLED CONDUCTING REGION GEOMETRY IN SEMICONDUCTOR DEVICES

Robert R. Bockemuehl, Birmingham, and James E. Kauppila, Southfield, Mich., assignors to General Motors Corporation, Detroit, Mich., a corporation of Delaware Filed Aug. 17, 1961, Ser. No. 132,083
2 Claims. (Cl. 317—235)

This invention relates to semiconductor device structure and a method for controlling the thickness and location of conductive or photoconductive regions in an otherwise insulating crystal and more particularly to such structure and method in a class of crystal materials known as insulating photoconductors and to amplifying means known as field effect transistors fabricated by this method.

Field effect transistors are conventionally made from semiconductors which have high carrier mobilities and moderate energy gaps such as Ge, Si, GaAs or InP. Although high mobility is desired in a transistor material, higher energy gap materials are also desirable, especially for high temperature application. Unfortunately, the known high energy gap semiconductors have lower carrier mobilities.

The class of high energy gap materials known as insulating photoconductors, although their mobilities are moderate, have certain other properties which can be exploited by the disclosed method in order to obtain useful amplification. These materials include the sulphides and tellurides of cadmium and zinc as well as $Cu_2O$, HgS, SiC, GaP, $Cs_3Sb$ and others.

It is an object in making this invention to provide a method for treating an insulating photoconductor material to convert regions thereof to be conductive and to further control the location and size of these regions in the material.

It is a further object in making this invention to provide a field effect transistor fabricated from a class of materials heretofore not considered usable.

It is a still further object to provide a field effect transistor formed of an insulating photoconductor material.

It is a still further object to provide a field effect transistor formed of cadmium sulphide.

It is a still further object in making this invention to provide a method which permits the designer an additional control of the resulting transistor properties by enabling control of conducting and insulating region geometry within the crystal.

Field effect transistors amplify by the principle of the modulation of the conductance of a channel along the length of a crystal by a depletion layer whose extent through the thickness of the crystal can be controlled by a voltage on a control electrode. The performance of such a device is characterized by its mutual transconductance $G_m$; that is, the change in conducting channel current which results from a unit change of control electrode voltage. The $G_m$ is greatest when the conducting region is very thin. The more conventional semiconductors have considerable conductance at room temperature which makes the conducting channel thickness primarily dependent on the crystal thickness. Thickness of the order of microns is usually required for useful amplification to be obtained. This imposes prohibitive mechanical rigidity and crystal shaping tolerance limits.

The properties of insulating photoconductors are such that thin conductive regions can be formed in an otherwise insulating crystal. This reduces the relationship between conducting channel and crystal thickness to a secondary dependence. High mechanical strength can be obtained and precision machining tolerances and deleterious surface effects can be avoided.

Field effect transistor properties are determined not only by the conducting channel thickness, but also by its distance from the control electrode surface. Maximum $G_m$ is obtained when this distance is as small as possible. However, frequency response and input-output linearity are improved as that distance is increased. Therefore, the ability to control this distance offers an additional degree of freedom to the device designer.

The method of this invention makes use of unique action and interaction of donor and acceptor impurities in insulating photoconductor materials.

Like in conventional semiconductors, donors increase n-type extrinsic conductivity in insulating photoconductors. However, unlike the case for conventional semiconductors, acceptors do not ionize thermally at normal temperatures and thus do not produce appreciable p-type conductivity. Nevertheless, the acceptors will compensate existing donors and reduce, or even eliminate, n-type conductivity.

The "pure" crystal is effectively an insulator. Incorporation of donor impurities into a certain region of the crystal will render that region conductive. Incorporation of acceptors into a portion of the region thus made conductive can return that portion to an insulating state.

Thus, a conductive region having controlled dimensions and location can be formed in a material by suitable planned incorporation of donor and acceptor impurities.

Similar techniques can be used to produce a highly photoconductive region of controlled dimensions and location in a crystal. A "pure" crystal has moderate photoconductivity. Incorporation of most impurities tends to decrease photoconductivity by their serving as re-combination centers. However, if the impurity state is an acceptor which has been compensated by (captured an electron from) a donor, photoconductivity can be enhanced several orders of magnitude.

Thus, incorporation of acceptors and donors into a region of the material can render that region highly photoconductive. Other regions in which acceptor densities greatly exceed donor densities can approach insulating properties even when illuminated.

Our invention may be applied to various materials having relatively large energy gaps and the amplifying means produced may take on a variety of physical shapes or forms. The present showing, therefore, is merely illustrative of the basic principles of our discoveries and in nowise should be taken as limiting the broad aspects.

With these and other objects in view which will become apparent as the specification proceeds, our invention will be best understood by reference to the following specification and claims and the illustrations in the accompanying drawings, in which:

Figure 1:
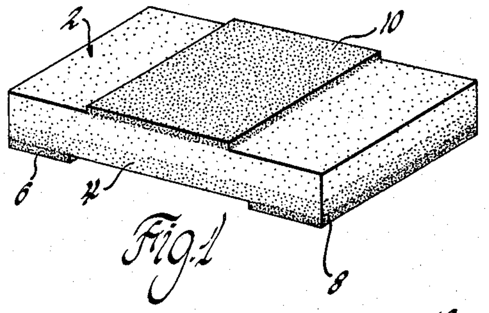
FIGURE 1 is perspective view of a field effect transistor embodying our invention.

Referring now more particularly to the drawings there is shown in FIG. 1 an example of a field effect transistor device embodying our invention. As exemplary, let it be assumed that the crystal is formed of cadmium sulphide although other materials may also be used. This crystal in its basic form is an insulator. By adding certain impurities to a predetermined region of the same, that region can be made to conduct electric current while the remainder of the crystal still remains an electrical insulator. In FIG. 1 the basic crystal 2 has had impurities added to the region 4 near its lower surface by a process to be described so that this thin flat region is electrically conductive. Depending on the properties and concentration of the imprity this region may be conductive in the dark, or only when illuminated (photoconductive). Ohmic contacts 6 and 8 are applied to the lower surface of the crystal by deposition of a suitable metal thereon. The control electrode 10 is formed on the upper surface of the crystal 2 and this is a blocking contact, the voltage on which will control the current through the conducting region 4.

This method involves the selective introduction of acceptor and donor impurities into the crystal. In some instances one of the impurities can be introduced homogeneously during the crystal growth process. In certain cases the role of one of the impurities could be performed by stoichiometric defects such as anion or cation vacancies.

At least one or, more often, both impurities must be introduced such that an impurity gradient is formed. This can be performed by exposing a selected portion of the crystal surface to a desired impurity concentration and heating with controlled temperature and time for diffusion into the crystal. The surface can be exposed to the impurity in the form of a vapor or a liquid. Or, a very effective method is to deposit a very thin film of the impurity on a selected area of the surface and then heat to diffuse it into the crystal.

There are a variety of donor and acceptor impurities which can be used for a particular semiconductor material. For example, in a binary semiconductor compound composed of elements from Groups II and VI of the periodic table such as CdS, the elements from Group III or VII act as donors (i.e. In or Cl), while those from Group I or V are acceptors (i.e. Cu or Sb). Therefore, impurities can be selected on the basis of optimum diffusion properties for the desired results.

Inasmuch as these materials have a high energy gap, instrinsic conductivity remains low at elevated temperatures. This permits electrical measurements of conduction and junction properties to be made during the high temperature impurity diffusion processes. This is an important advantage in controlling the fabrication process.

Figure 3:
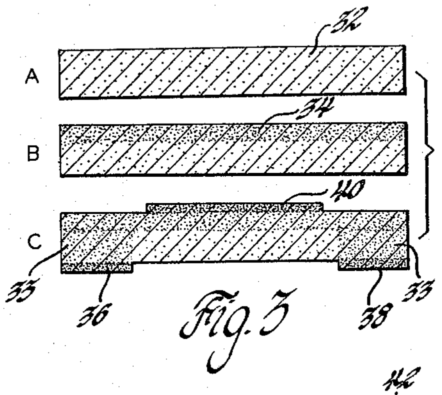
FIGURES 2, 3 and 4 are a series of side views of a basic crystal illustrating the various steps in fabricating a field effect transistor having the conducting region at different depths in the same.
Figure 2:
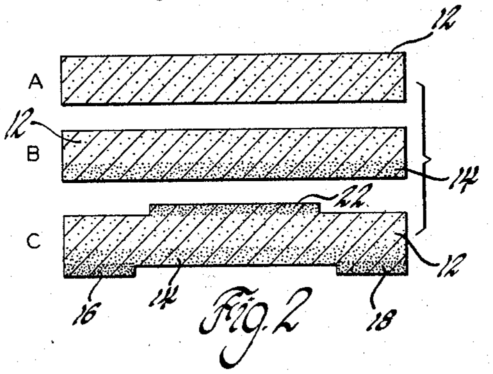
Figures 4, 6:
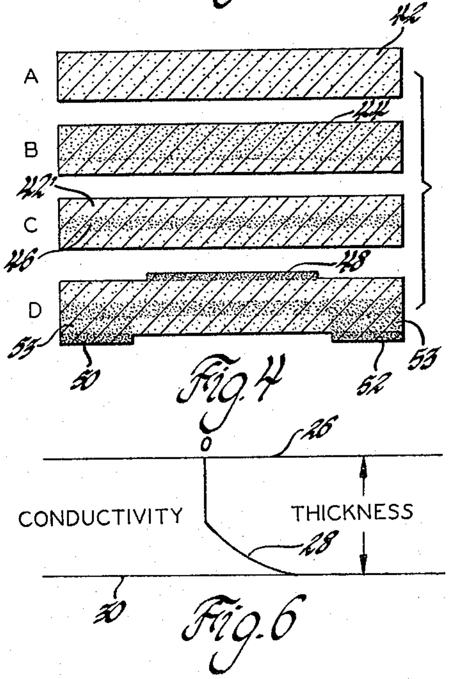

In FIG. 1 the control electrode 10 must be a blocking junction about which a depletion layer can be formed. In such cases where the conducting region is formed adjacent the control electrode surface as illustrated in FIG. 3 the material for the control electrode would be selected so that a potential barrier would be formed due to the difference in work functions between the electrode material and the crystal surface, such as copper or tellurium for cadmium sulfide. In cases, however, where the conducting region is separated from the control electrode surface by an insulating region as shown in FIGS. 2 and 4, the junction is formed at the transition between the conducting and insulating region. This results from the high electron density gradient which exists at that point. The diffusion of electrons along that gradient produces the necessary potential barrier.

The ohmic electrodes 6 and 8 in FIG. 1 must form ohmic connection to the conducting region itself; that is, any potential barrier which exists between the ohmic contact and the conducting layer must be negligible. This is accomplished when the conducting region is separated from the ohmic electrode surface as shown in FIGS. 3 and 4, by depositing a suitable donor metal film, such as indium on cadmium sulphide, at the desired location and diffusing some of the metal into the film as shown at 33 and 53 so that a conductive region is formed between the ohmic electrodes and the conducting channel.

Figure 5:
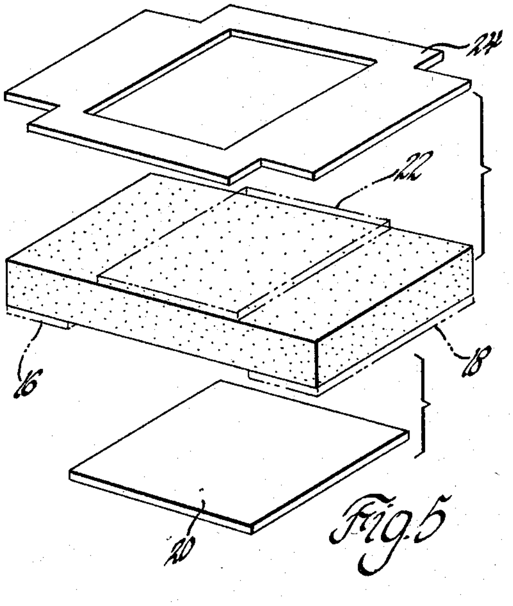
FIGURE 5 is an exploded perspective view of the masking means used in applying the external ohmic and blocking contacts to the basic crystal; and, FIGURES 6, 7 and 8 are graphs of the conductivity taken on a cross-section through the crystals of FIGS. 3, 4 and 5, respectively.

FIGURE 2 illustrates one form of our invention in which the cadmium sulphide crystal 12 shown in FIG. 2A is in its original or basic form and, therefore, is for practical purposes electrically non-conductive. In this instance a donor impurity such as indium is then diffused into the lower surface of the basic crystal as shown in FIG. 2B at 14 by the heavy stippling. This lower layer, therefore, becomes conductive while the remainder of the crystal 12 remains non-conductive. The ohmic electrodes 16 and 18 are then deposited by exposing the lower surface of the crystal to a suitable metal such as indium in a vapor or solute form and masking the same shown in FIG. 5 by plate 20. Plate 20 is laid upon the lower surface of the crystal leaving exposed the two end surfaces and then depositing the metal to form ohmic contacts 16 and 18 where desired. If the surface of the basic crystal 12 were exposed to a donor concentration at sufficiently elevated temperatures for a sufficiently long period the whole thickness of the crystal might be rendered electrically conductive. However, as indicated by the former discussion, it is desired to keep the conductive layer thin so that maximum control can be achieved by the control electrode. The control electrode 22 is applied across the upper surface of the crystal by depositing a suitable metal such as copper or tellurium through a mask 24 as shown in FIG. 5. This metal may or may not have to be diffused into the crystal a short distance to form a blocking contact with the cadmium sulphide, depending on the metal used. The resultant device then consists of cadmium sulphide crystal 12, the lower region of which is conductive and which carries a current between ohmic electrodes 16 and 18 when a proper voltage is applied. A control or modulating voltage applied to the control electrode 22 acts to reduce the thickness of the current path through the layer 14 and thus control the magnitude of the current. The potential barrier associated with the blocking contact 22 prevents appreciable gate electrode current.

FIGURE 6 shows a graph of the conductivity through the crystal 12 in FIG. 2. Conductivity in the graph of FIG. 6 increases toward the right of that figure and is relatively low or zero at the top surface 26 and remains at that value until it reaches the upper surface of the thin layer 14 of indium donor diffusion in the crystal. At that point the conductivity increases as shown by the rise 28 to the right and reaches a maximum at the lower surface 30.

For aforementioned reasons it may be desirable to locate the conductive layer on the top surface adjacent the control electrode and in that case FIG. 3 illustrates the formation of the device to obtain this result. FIGURE 3A shows the basic cadmium sulphide crystal 32 in its initial form. FIGURE 3B shows the crystal after indium has been diffused through the top surface 34 as shown by the heavier stippling, and lastly FIG. 3C shows the final field effect transistor including the ohmic electrodes 36 and 38, added conductive areas 33, and the control electrode 40.

Figure 7:
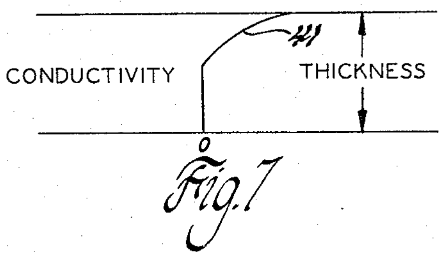

FIGURE 7 is a graph of the conductivity in cross-section through the crystal shown in FIG. 3. Like FIG. 6, it shows the conductivity graph as essentially zero at the bottom surface and having a high value 41 at the top surface where the indium has diffused in to provide excess donors.

By the use of our process and method we can not only change the conductivity of the cadmium sulphide from a substantial insulator to a layer of conducting material, but we can also return the conducting region to a non-conducting state if desired by the addition of acceptor impurities into the cadmium sulphide. This is useful in instances where the designer of the transistor desires to have the conductive material substantially in the middle of the crystal rather than adjacent to one of the outside surfaces and in such instance FIG. 4 illustrates how this can be accomplished. The original basic crystal 42 is shown in FIG. 4A. Indium is diffused into and perhaps two-thirds through the crystal from the top. This is shown in FIG. 4B and the indium diffused region 44 is shown as the heavily stippled part of the crystal. This portion of the crystal would then contain an excess of donor impurity and, therefore, would be electrically conductive. The lower surface would remain in its substantially original condition and would be an electrical insulator. An acceptor impurity such as copper would then be diffused into the top layer to compensate the excess donor impurities in that region and to return a portion of the conducting region 44 to a non-conducting state 42′ as shown in FIG. 4C. Care must be taken in this instance to stop the diffusion before the acceptor diffuses too far so as to compensate all of the indium donor excess impurities. This, therefore, leaves a central conductive layer 46 sandwiched between two non-conducting layers as shown in FIG. 4C. FIGURE 4D adds the control electrode 48 and the ohmic electrodes 50 and 52 and their associated conductive areas 53.

Figure 8:
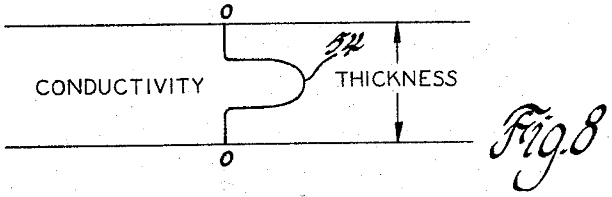

FIGURE 8 is the conductivity graph for the crystal shown in FIG. 4 and in this instance the conductivity is substantially zero at both the top and bottom surfaces but increases to a relatively high value at a central location shown by the curve 54. This central layer would be the conductive region in the transistor controlled by the voltage applied to the control electrode 48.

Other modifications of these described processes can be seen to produce similar, or slightly different conductivity distributions than those which have been illustrated. In fact the formation of a multipilicity of separated conducting regions in a single crystal is feasible by this method.

In practice, the materials involved, the sequence of steps, the impurity exposure technique, the diffusion temperature and time and the electrode deposition method are determined by the design specifications of the device and fabrication simplification considerations. For example, transistors having the configuration shown in FIG. 2 have have been fabricated from single crystals of both cadmium sulphide and cadmium selenide by vacuum deposition of a very thin film of indium on the bottom surface of the basic crystal 12 followed by successive vacuum deposition of thicker films of indium located to provide ohmic contacts 16 and 18 and a copper film to provide the control electrode 10 and then heating the entire structure at 400° C. for ten minutes. During this heating process the thin indium film diffuses into the crystal to form the conductive region 14 some of the heavier indium electrode material is diffused in to provide good ohmic connection and some of the copper electrode material is diffused in to produce the potential barrier required for the control electrode. Thus the process may be designed so that several of the steps involved may be carried out simultaneously.

From this description it will be clear that we have provided a method for changing the electrical conductivity of an insulating photoconductor and tailoring it to meet a variety of design requirements. By use of proper donor impurities we can convert the basic insulating material into a conducting material and then return the conducting region back to an insulating region by adding an excess of acceptor impurities. By this process we can obtain tailored conducting regions in a mechanically strong, basically insulating body, the body providing mechanical strength for the device and the conducting regions the desired transistor control action.

What is claimed is:

1. In a photosensitive field-effect transistor, a unitary, elongated body of relatively pure high energy gap, low mobility, photoconductive-type material, a relatively thin surface diffusion zone on said body having a generally balanced concentration of donor and acceptor impurities enhancing photoconductivity of said zone, source and drain ohmic contacts to said zone, and a gate electrode in blocking contact with said diffusion zone for regulating current flow in the diffusion zone.

2. A device such as recited in claim 1 wherein the high energy gap, low mobility, photoconductive-type material is at least one member selected from the group consisting of cadmium sulfide, cadmium telluride, zinc sulfide, zinc telluride, cuprous oxide, mercuric sulfide, silicon carbide, cadmium phosphide and cesium antimonide.

References Cited by the Examiner

UNITED STATES PATENTS

| | | | |
|---|---|---|---|
| 2,641,713 | 6/1953 | Shive | 250—211 |
| 2,695,852 | 11/1954 | Sparks | 317—235 |
| 2,744,970 | 5/1956 | Shockley | 317—234 |
| 2,854,612 | 9/1958 | Zaratkiewicz | 317—235 |
| 2,875,505 | 3/1959 | Pfann | 29—25.3 |
| 2,952,804 | 9/1960 | Franke | 317—235 |
| 2,975,344 | 3/1961 | Wegener | 317—235 |
| 3,028,655 | 4/1962 | Dacey et al. | 29—25.3 |
| 3,051,839 | 8/1962 | Carlson et al. | 317—234 |

OTHER REFERENCES

Cadmium Sulfide Field Effect Phototransistor, by R. R. Bockemuehl, published in the Proceedings of the IRE, May 1960, pp. 875–882.

JOHN W. HUCKERT, *Primary Examiner.*

BENNETT G. MILLER, DAVID J. GALVIN, L. ZALMAN, *Examiners.*

R. F. POLISSACK, *Assistant Examiner.*